US009602750B2

(12) United States Patent
Hynecek

(10) Patent No.: US 9,602,750 B2
(45) Date of Patent: Mar. 21, 2017

(54) IMAGE SENSOR PIXELS HAVING BUILT-IN VARIABLE GAIN FEEDBACK AMPLIFIER CIRCUITRY

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 127 days.

(21) Appl. No.: 14/553,822

(22) Filed: Nov. 25, 2014

(65) Prior Publication Data

US 2016/0150174 A1     May 26, 2016

(51) Int. Cl.
| | |
|---|---|
| *H04N 5/335* | (2011.01) |
| *H01L 27/00* | (2006.01) |
| *H01L 31/062* | (2012.01) |
| *H04N 5/3745* | (2011.01) |
| *H01L 27/146* | (2006.01) |
| *H04N 5/355* | (2011.01) |
| *H04N 5/363* | (2011.01) |

(52) U.S. Cl.
CPC ..... *H04N 5/37457* (2013.01); *H01L 27/1463* (2013.01); *H01L 27/14609* (2013.01); *H01L 27/14612* (2013.01); *H01L 27/14641* (2013.01); *H01L 27/14643* (2013.01); *H04N 5/35527* (2013.01); *H04N 5/363* (2013.01); *H04N 5/37452* (2013.01)

(58) Field of Classification Search
CPC .... H01L 27/1464; H01L 27/14643–27/14663; H04N 5/374–5/37457

USPC ..... 348/308, 301, 302, 294, 300; 250/208.1; 257/291, 292, 294, 440, 443–448
See application file for complete search history.

(56) References Cited

U.S. PATENT DOCUMENTS

| | | | |
|---|---|---|---|
| 5,625,210 A | 4/1997 | Lee et al. | |
| 6,121,843 A * | 9/2000 | Vampola | G11C 27/026 250/214 A |

(Continued)

OTHER PUBLICATIONS

Hynecek, U.S. Appl. No. 14/183,042, filed Feb. 18, 2014.

*Primary Examiner* — Xi Wang
(74) *Attorney, Agent, or Firm* — Treyz Law Group, P.C.; Michael H. Lyons

(57) ABSTRACT

An image sensor may include an array of image sensor pixels. Each pixel may have a photodiode, a floating diffusion node, and charge transfer gate. An amplifying transistor may have a gate terminal coupled to the floating diffusion and a drain terminal coupled to an output node. The amplifying transistor may provide signal corresponding to transferred charge with a greater than unity voltage gain. A negative voltage feedback capacitor having variable capacitance may be coupled between the output node and the floating diffusion node thereby increasing the pixel dynamic range. A reset transistor may be coupled between the floating diffusion and output node. The amplifying transistor may include a p-channel transistor formed within a mini n-well region of the pixel or an n-channel transistor formed within a mini p-well region. The pixel may have increased storage capacity and dynamic range relative to conventional designs.

17 Claims, 9 Drawing Sheets

(56) References Cited

U.S. PATENT DOCUMENTS

| | | | |
|---|---|---|---|
| 6,445,014 B1* | 9/2002 | Rhodes | H01L 27/14609 |
| | | | 257/185 |
| 6,952,004 B2 | 10/2005 | Henderson | |
| 8,159,011 B2 | 4/2012 | Hynecek | |
| 8,471,310 B2 | 6/2013 | Hynecek | |
| 8,513,753 B1* | 8/2013 | Jenne | H01L 27/14638 |
| | | | 257/431 |
| 8,558,931 B2 | 10/2013 | Hynecek | |
| 8,610,046 B2 | 12/2013 | Van Blerkom | |
| 8,710,420 B2 | 4/2014 | Hynecek | |
| 2004/0201071 A1* | 10/2004 | Dosluoglu | H01L 27/14647 |
| | | | 257/431 |
| 2007/0165117 A1* | 7/2007 | Toya | H04N 5/3598 |
| | | | 348/241 |
| 2010/0072350 A1* | 3/2010 | De Wit | H04N 5/37452 |
| | | | 250/208.1 |
| 2010/0243866 A1* | 9/2010 | Mo | H03F 3/08 |
| | | | 250/214 A |
| 2011/0266645 A1* | 11/2011 | Chao | H01L 27/14603 |
| | | | 257/432 |
| 2011/0267505 A1* | 11/2011 | Dierickx | H04N 5/357 |
| | | | 348/241 |
| 2013/0146747 A1 | 6/2013 | Hynecek | |
| 2014/0085523 A1 | 3/2014 | Hynecek | |
| 2015/0263058 A1* | 9/2015 | Konstantin | H01L 27/1461 |
| | | | 257/292 |

* cited by examiner

IMAGE SENSOR PIXELS HAVING BUILT-IN VARIABLE GAIN FEEDBACK AMPLIFIER CIRCUITRY

BACKGROUND

This relates to solid-state image sensor arrays (e.g., complementary metal-oxide-semiconductor (CMOS) arrays) and, more specifically, to image sensors with pixels having built-in voltage feedback amplifier circuitry. The pixels can have submicron sizes and can be illuminated from the back side or the front side of a pixel substrate on which the pixels are formed.

Typical image sensors sense light by converting impinging photons into electrons (or holes) that are integrated (collected) in sensor pixels. Upon completion of each integration cycle, the collected charge is converted into voltage signals, which are supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog voltage signal can sometimes be converted on-chip to a digital equivalent before being conveyed off-chip. Each pixel includes a buffer amplifier (i.e., source follower) that drives output sensing lines that are connected to the pixels via respective address transistors.

However, such arrangements involve below unity gain amplifier (i.e., a gain less than 1 in which the output has a lesser magnitude than the input) within the pixel. This makes the signal lines connected to the pixels susceptible to various noise and interference pickups, which is one of several disadvantages of the existing technology. After the charge-to-voltage conversion is completed and after the resulting signals are transferred out from the pixels, the pixels are reset before a subsequent integration cycle begins. In pixels that include floating diffusions (FD) serving as the charge detection node, this reset operation is accomplished by momentarily turning on a reset transistor that connects the floating diffusion node to a voltage reference (typically the pixel current drain node) for draining (or removing) any charge transferred onto the FD node. However, removing charge from the floating diffusion node using the reset transistor generates thermal kTC-reset noise, as is well known in the art. This kTC reset noise must be removed using correlated double sampling (CDS) signal processing techniques in order to achieve desired low noise performance. Typical CMOS image sensors that utilize CDS require at least four transistors (4T) per pixel. An example of the 4T pixel circuit with a pinned photodiode can be found in Lee (U.S. Pat. No. 5,625,210), incorporated herein as a reference.

FIG. 1 shows a simplified circuit diagram of a pixel 100 in a CMOS sensor. Pixel circuit 100 has a two-way shared photodiode scheme in which two photodiodes share a single floating diffusion node. In particular, photodiodes 101 (PD1) and 102 (PD2) share common floating diffusion (FD) charge detection node 114 to which source follower (SF) transistor 103 is connected. The drain terminal of source follower transistor 103 is connected to Vdd column bias line 109 and the source terminal of source follower transistor 103 is connected to column output signal (readout) line 108 through addressing transistor 104. Charge detection node 114 is reset by reset transistor 105, which is also connected to Vdd column bias line 109. Charge from photodiodes 101 and 102 is transferred onto floating diffusion node 114 by charge transfer transistors 106 and 107, respectively. Reset transistor gate 105 is controlled by reset control signals received over row control line 110, charge transfer transistor gates 106 and 107 are controlled by transfer control signals received over row lines 112 and 113, respectively, and addressing transistor gate 104 is controlled by row select control signals received over row addressing line 111. As shown in FIG. 1, it is clear that each pair of pixel photodiodes must be coupled to a total of five transistors (i.e., 2.5 transistors per photodiode). Conventional arrangements such as the arrangement of FIG. 1 involve below unity gain amplification generated by the buffer amplifier of source follower 103, causing signal line 108 to be susceptible to noise and interference pickups, which can distort the final image signal produced by the pixel.

It would therefore be desirable to be able to provide improved image sensor pixels.

DETAILED DESCRIPTION

Figure 2:
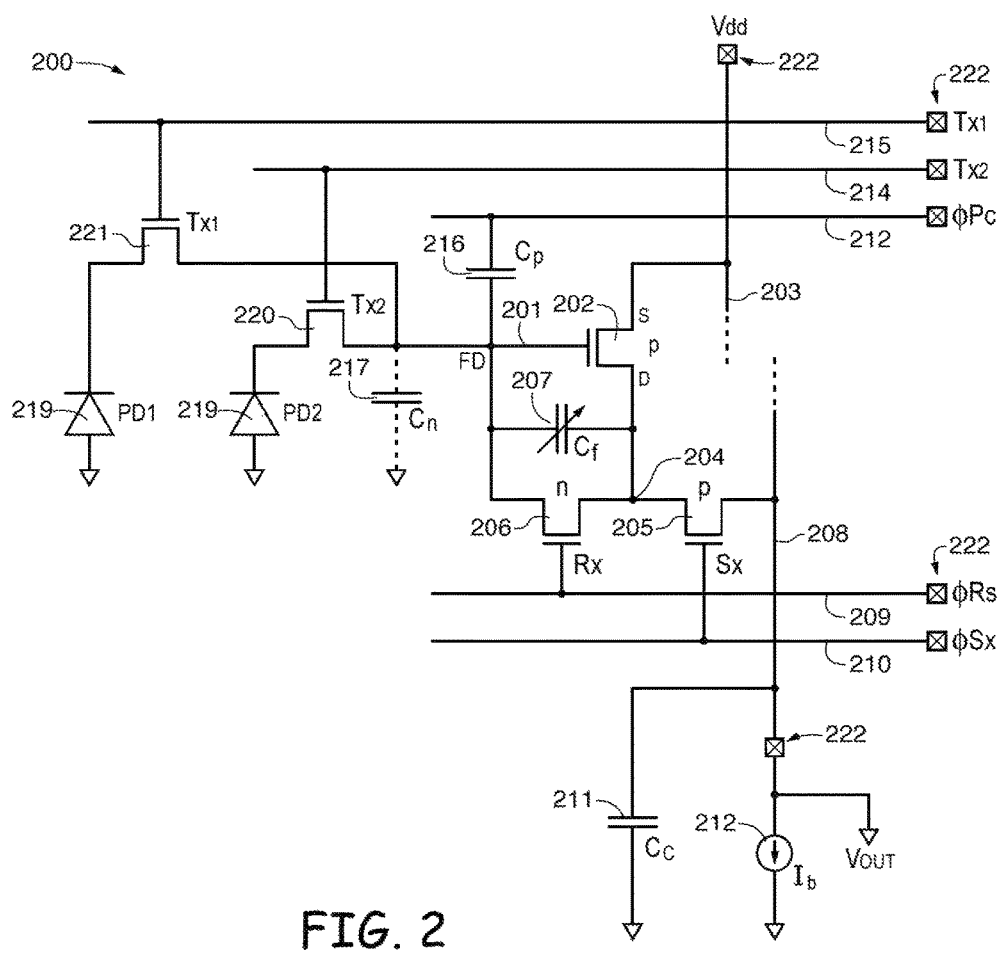
FIG. 2 is an illustrative circuit diagram of an image sensor pixel having two photodiodes that share a common floating diffusion region having a p-channel gain transistor, a p-channel addressing transistor, an n-channel reset transistor, a pre-charge capacitor, and a variable feedback capacitor for improving the noise susceptibility of the image sensor pixel in accordance with an embodiment of the present invention.

A simplified circuit diagram of an illustrative image sensor pixel having built-in amplifier circuitry with adjustable gain is shown in FIG. 2. As shown in FIG. 2, pixel circuit 200 may include a first photodiode 219 (PD1) and a second photodiode 218 (PD2) that share the same pixel circuitry 200. This example is merely illustrative and, if desired, pixel 200 may include four or more photodiodes that share a common charge detection circuit. Charge transfer transistor 220 may connect second photodiode 218 to common (shared) floating diffusion node 201 (sometimes referred to herein as a charge storage node, charge detection node, charge storage region, floating diffusion region, or floating diffusion junction region). Charge transfer transistor 221 may connect first photodiode 219 to floating diffusion node 201. The gates of transfer transistors 220 and 221 may receive transfer control signals from row control circuitry (not shown for the sake of simplicity) over row control lines 214 and 215, respectively.

Charge detection node 201 may be connected to pre-charge capacitor 216 (having capacitance Cp). Capacitor 216 may be coupled between node 201 and row control line 212 for receiving a controlling signal. Feedback capacitor 207 (having variable capacitance Cf), the gate terminal of p-channel metal-oxide-semiconductor field-effect transistor (MOSFET) 202 (sometimes referred to herein as gain transistor 202, amplifying transistor 202, or amplifier transistor 202), and the source terminal of n-channel MOSFET reset transistor 206 may be coupled to charge storage node 201. Floating diffusion node 201 may have an equivalent capacitance Cn as indicated by capacitor 217. The drain terminal of p-channel MOSFET transistor 202, the drain terminal of n-channel MOSFET reset transistor 206, feedback capacitor 207, and p-channel MOSFET addressing transistor 205 may be coupled to circuit output node 204 (sometimes referred to as pixel output node 204). Addressing transistor 205 may connect output node 204 to column sense line 208, which is common to all the pixels in that column of the corresponding pixel array and delivers the selected pixel output signal to the periphery of the array.

The source terminal of p-channel MOSFET transistor 202 may be coupled to column line 203 over which bias voltage Vdd is provided to all corresponding the transistors in that column of the array. Reset transistor 206 may receive reset control signals from row control circuitry over row control line 209 and addressing transistor 205 may receive row select (addressing) control signals from the row control circuitry over row control line 210. The capacitance of signal output column line 208 is indicated by column capacitor 211 (e.g., having capacitance Cc). Column output line 208 may be coupled to constant current source 212. Current source 212 may provide current bias to the selected pixels 200. The connections of the pixel array to the periphery or to the underlying chip that carries the rest of the image processing circuits are indicated by via connections 222.

Figure 3:
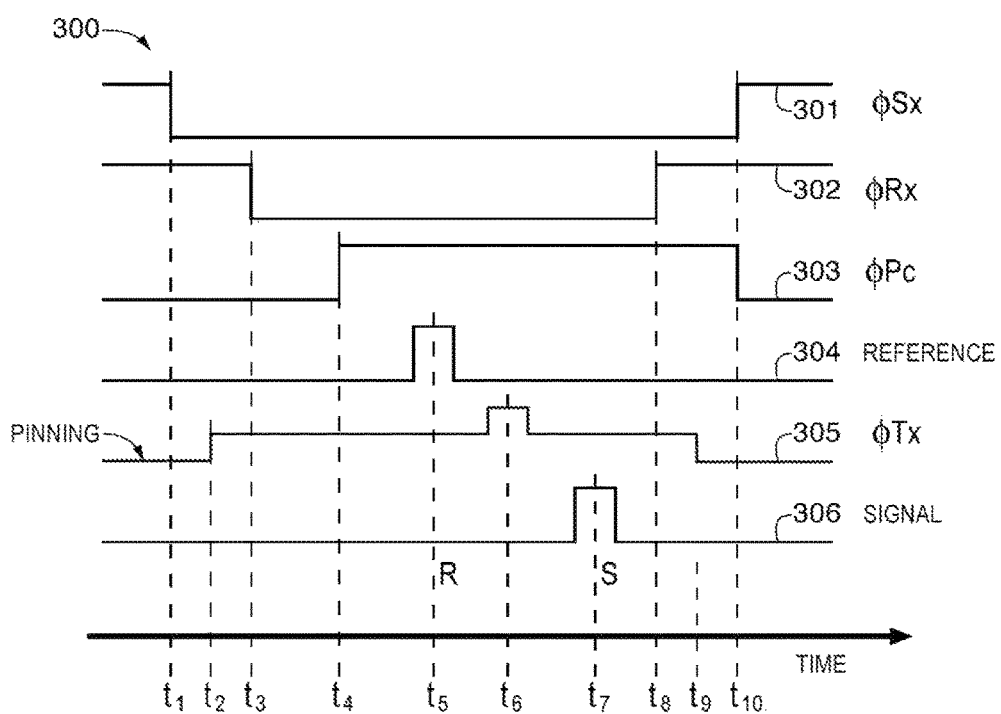
FIG. 3 is an illustrative timing diagram of a readout sequence performed by a selected row of image sensor pixels having the circuit of the type shown in FIG. 2 in accordance with an embodiment of the present invention.

The operation of pixel circuit 200 can be understood from the simplified timing diagram 300 shown in FIG. 3. For the sake of simplicity, this diagram shows only the signal readout from one of the shared photodiodes (e.g., photodiode 219 of FIG. 2) in a given selected row of the array. As shown in FIG. 3, pixel readout operations begin by turning on p-channel MOSFET row select transistor 205 for the pixels of the selected row of the pixel array. This may be accomplished by applying waveform 301 to the gate of addressing transistor 205 at the time t1. This may be followed by applying a partial step signal 305 to the gate of charge transfer transistor 221 at the time t2, which, however, does not start the charge transfer from the photodiode to the charge detection node 201. This step lowers the voltage swing on transfer gate 221 that lowers the feed through from this gate to the floating diffusion node 201. This operation is beneficial for the circuit operation, as the transfer gate is typically biased by a considerable negative bias to accumulate holes under the gate and thus to minimize the generation of dark current from the silicon-silicon dioxide interface states in the region under this gate. The partial step signal 305 eliminates this bias and prepares the gate for the charge transfer at a later time.

In the next step, the pixel reset may be released by applying signal 302 at time t3 to the gate of reset transistor 206. This step may be followed by applying pre-charge pulse 303 at lime t4 to charge detection node 201 through pre-charge capacitor 216. This step is important because it lowers the pixel output to its minimum level and thus provides the necessary output voltage swing margin for the signal. The pixel output signal Vout may be sampled after the elapse of a certain settling time given by a correlated double sampling (CDS) reference pulse R at time t5, as is indicated by waveform 304. This step may be followed by charge transfer from the selected pixel photodiode 219 at the time to by applying the full charge transfer pulse (waveform 305). This causes the pixel output to swing higher, thus partially compensating for the previously introduced pre-charge signal to the floating diffusion node 201. It is thus clear that the level of the pre-charge should be commensurate with the level of the expected charge signal from the photodiode. It is also clear that the voltage swing on floating diffusion node 201 is minimal due to the action of negative feedback through feedback capacitor 207 from the pixel output 204. The low voltage swing on floating diffusion node 201 is another advantage of this in-pixel amplifier concept, which allows design and operation of the pinned photodiode with a higher pinning voltage and thus an increase in its charge storage capacity relative to conventional pixels.

The pixel output level may be sampled again after the elapse of a certain settling time by the CDS circuits at the time t7 by the pulse S as is indicated by waveform 306. The readout sequence may be completed by turning on reset transistor 206 at time t8 (waveform 302), biasing off transfer gate 221 to its pinning level at time t9 (waveform 305), and finally turning off the pre-charge pulse and the pixel addressing transistor at time t10 (waveforms 301 and 303).

Figure 1:
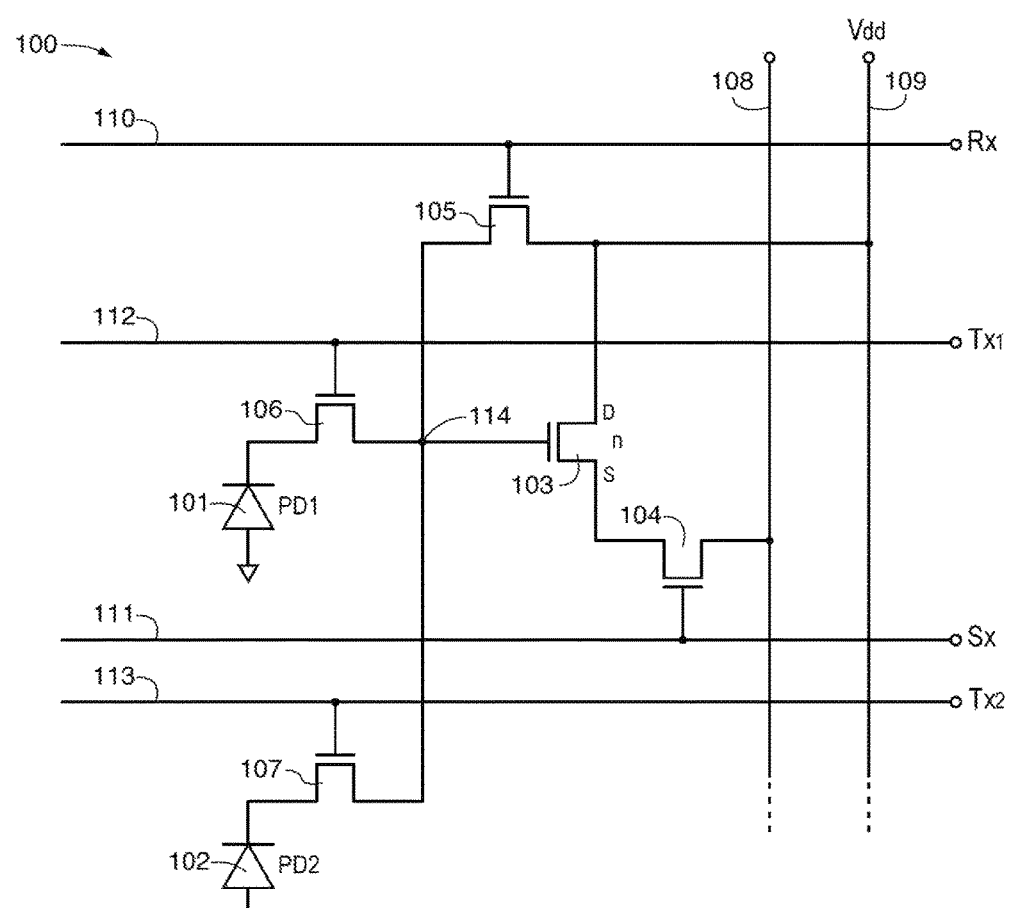
FIG. 1 is a simplified circuit diagram of a conventional image sensor pixel having two photodiodes sharing the same pixel circuitry, which includes two transfer gates, a source follower transistor, an addressing transistor, and a reset transistor.
Figure 4:
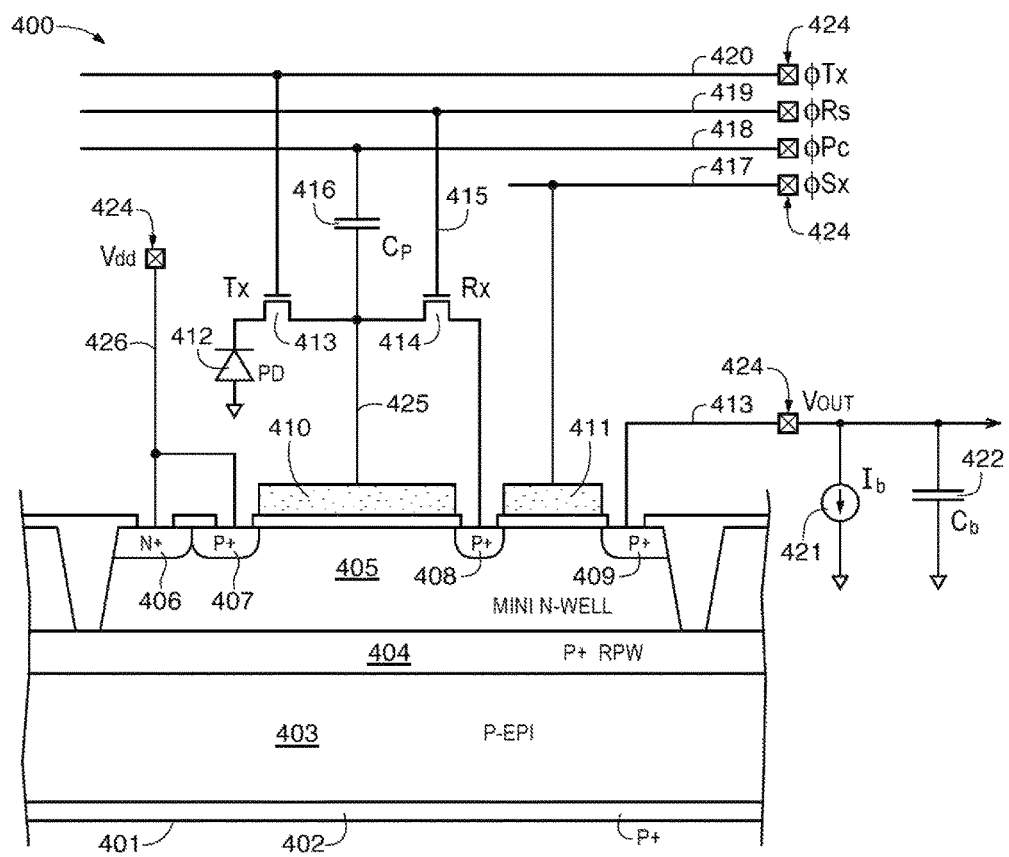
FIG. 4 is an illustrative diagram of a pixel circuit and a corresponding partial pixel cross section showing how gain and addressing transistors of the type shown in FIG. 2 may be placed within a mini n-well region of the pixel substrate in accordance with an embodiment of the present invention.

In conventional image sensor pixels (such as the type shown in FIG. 1), the source follower transistors are n-channel type transistors. In the present invention as illustrated in FIG. 3 in which an in-pixel amplifier circuit is formed (e.g., an amplifier circuit built into the pixel), the transistor that amplifies the signal detected on floating diffusion node 201 is a p-channel MOSFET transistor preferably with a p-type doped poly-silicon gate e.g., as opposed to the n-channel source follower transistor of FIG. 1). For this reason, it may be necessary to form a miniature n-type well region 405 as shown in FIG. 4. The mini n-type well 405 may be a lightly n-type doped region in the pixel substrate and may sometimes be referred to herein as a mini n-well, miniature n-well, or simply as the n-well of the pixel. The pixel substrate may be a p-type doped epitaxial layer 403. P-channel MOSFET transistor 202 may be formed within this mini n-well region 405.

FIG. 4 shows a simplified device cross section 400 and circuit schematic diagram of a pixel having built-in amplifier circuitry such as pixel circuit 200 of FIG. 2. In particular, the example of FIG. 4 shows a simplified schematic of the charge transfer transistor 413 (corresponding to transistor 221 of FIG. 2, for example), photodiode 412 (e.g., corresponding to photodiode 219), reset transistor 414 (corresponding to reset transistor 206), and pre-charge capacitor 416 (corresponding to capacitor 216), and a simplified device cross section of corresponding built-in (intra-pixel) amplifier transistor gate 410 (corresponding to transistor 202) and the corresponding addressing transistor gate 411 (corresponding to transistor 205).

As shown in FIG. 4, transistor gates 410 and 411 are both placed within mini n-well region 405. Transistor gates 410 and 411 are typically isolated from the epitaxial substrate 403 by a silicon dioxide layer or other suitable insulators such as a combination of oxide and nitride layers. The floating diffusion charge detection node 201 of FIG. 2 is shown as node 425, which may also have a feedback capacitor (e.g., capacitor 207) connected to it (not shown for the sake of simplicity). The amplifying p-channel MOSFET transistor 410 may have a corresponding source terminal 407 connected to Vdd column bias line 426 (corresponding to line 203 of FIG. 2). Line 426 may be connected to n+ doped region 406 that provides the bias voltage to mini n-well 405. Mini n-well 405 may be partially or fully depleted of electron mobile charge. P-channel MOSFET transistor 410 may have a drain terminal shown by region 408 that is common (shared) with the drain of the addressing transistor (gate 411). Region 409 may be the source terminal of addressing transistor 411 and may be connected to common signal column line 423 (corresponding to line 208) that supplies the signal to the array periphery or through via 424 to the carrier chip in the case that a chip stacking technology is used. The transistor controlling signals may be supplied to the pixels through row lines 417, 418, 419 and 420, respectively. The amplifier circuit may be biased by current source 421 (corresponding to current source 212) that is located at the sensor array periphery or on the carrier chip. The column sense line may have a capacitance Cb as indicated by capacitor 422 (corresponding to capacitor 211) that may also include via capacitance.

A p+ type retrograde doped p-well (RPW) layer 404 may be placed under the partially or fully depleted mini n-well 405 to prevent light generated electrons in the bulk of the epitaxial layer 403 from entering into mini n-well 405. These electrons are thus diverted to flow into the photodiode 412, which is shown in the drawing only schematically for the sake of simplicity. In scenarios where the image sensor pixel is illuminated from the back side of the substrate (e.g., from the bottom of FIG. 4), the silicon substrate 401 may include a p+ type doped layer 402 deposited at the back side surface to minimize interface states generated dark current.

This example is merely illustrative. In another suitable arrangement, addressing transistor 411 may be an n-channel type transistor. In scenarios where holes are collected in the photodiodes instead of electrons, the doping of all the layers and the junctions may be inverted as well as the corresponding bias voltages. This results in the epitaxial layer being n-type doped, the RPW layer being changed to an RNW layer and retrograde doped by the n+ type doping, the mini n-well changed to a mini p-well, and all the remaining junctions changed to opposite polarities, for example.

Figure 5:
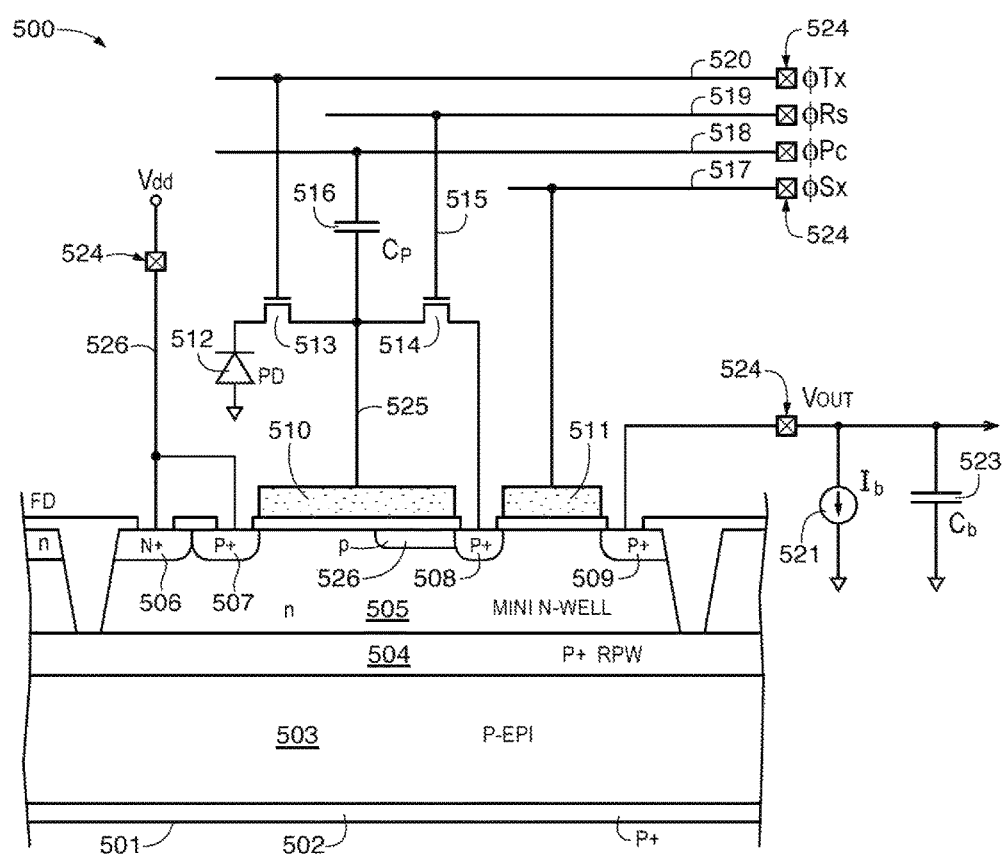
FIG. 5 is an illustrative diagram of a pixel circuit and a corresponding partial pixel cross section of an image sensor pixel of the type shown in FIG. 2 further illustrating how p-type doped drain extension portions of a gain transistor may form a variable capacitance for controlling amplifier gain depending on the number of detected electrons in accordance with an embodiment of the present invention.

Another suitable arrangement for the pixel having built-in amplifier circuitry is shown in FIG. 5. As shown in FIG. 5, drawing 500 may be similar to drawing 400 in FIG. 4 with all the elements starting with the number 501 and ending with the number 525 corresponding to the elements starting with the number 401 and ending with the number 425 of FIG. 4 (e.g., element 525 corresponds to element 425, element 514 corresponds to element 514, etc.). The difference between the arrangement of FIG. 5 and the arrangement of FIG. 4 is in the structure of the p-channel MOSFET gain amplifier transistor 510, where a p-type doped extension region 526 has been added to the structure. This extension is formed in the path of the transistor current flow, but may alternatively be placed away from the transistor channel current flow in a direction perpendicular to the drawing page. In yet another suitable arrangement, a completely independent capacitance varying structure may be formed and connected to the drain terminal of gain transistor 510 and the corresponding gate terminal by suitable wiring.

Drain extension region 526 may provide a variable voltage dependent feedback capacitance (Varicap) that changes the amplifier gain depending on the number of electrons transferred from the photodiode 512 onto floating diffusion node 525. Due to the application of the pre-charge pulse to floating diffusion node 525 through pre-charge capacitor 516, the p-channel MOSFET gain transistor output voltage may be changed to a lower level. This action increases the voltage difference between the gain transistor gate 510 and its drain terminal 508, thus hilly depleting the p-type doped extension 526. When extension 526 is fully depleted of holes, the gate to drain capacitance (the feedback capacitance Cf) is low and the amplifier gain is therefore high. When a larger amount of charge is transferred onto floating diffusion node 525, the gain transistor drain voltage increases and drain extension 526 begins to be again populated by holes. This increases the magnitude of feedback capacitance Cf and consequently reduces the amplifier gain (e.g., the gain associated with transistor 202 of FIG. 2). It is thus possible, by selecting the correct doping level, the suitable doping profile, and the size for the drain extension 526, to control the pixel charge to voltage transfer characteristic such that a nonlinear transfer function can be designed for the output voltage.

Figure 7:
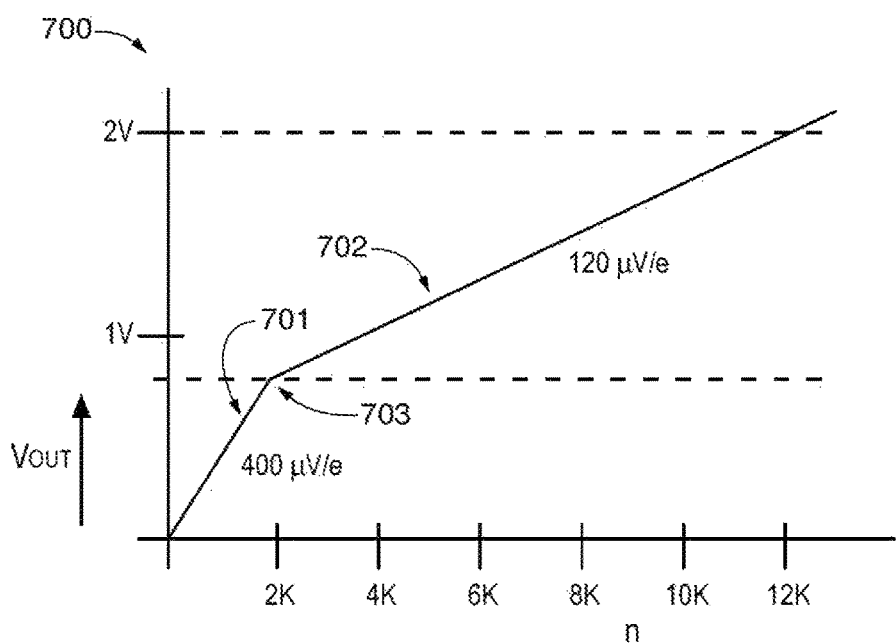
FIG. 7 is an illustrative graph showing the dependence of pixel output voltage of a pixel of the type shown in FIG. 2 on the number of input electrons received from the corresponding photodiode where a break point in the graph may depend on a doping level of a p-type doped drain extension of the type shown in FIG. 5 in accordance with an embodiment of the present invention.

An example of such a nonlinear piece-wise transfer function characteristic is shown in graph 700 of FIG. 7. In the example of FIG. 7, the doping level for the extension 526 is selected such that when 2000 electrons have been transferred onto floating diffusion 525, the charge to voltage conversion characteristic changes from 400 uV/e to 120 uV/e. This effect increases the pixel dynamic range. It is now possible to detect 12,000 electrons instead of only 5000 electrons for a given pixel output voltage swing if the conversion factor of 400 uV/e is kept unchanged. The high value of the charge to voltage conversion factor is desirable for the detection of low light level signals. This concept thus maintains high sensitivity for tow level signals and, at the same time, accommodates high level signals. This feature thus extends the dynamic range of the image sensor.

Figure 6:
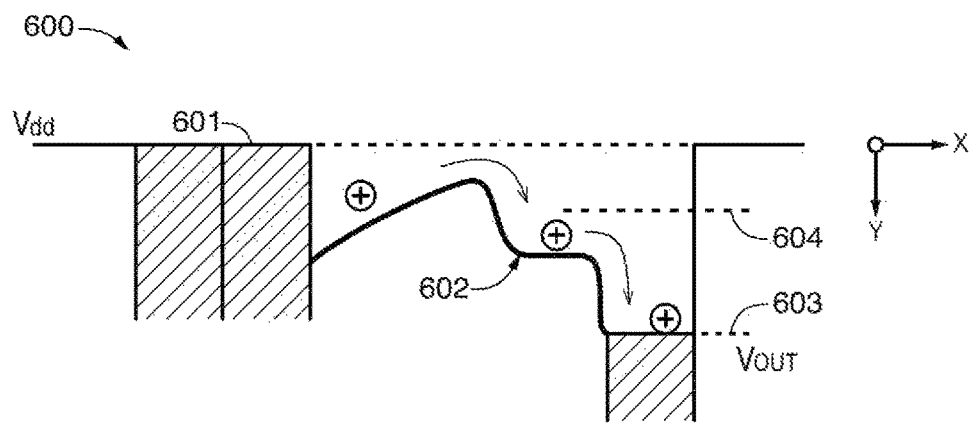
FIG. 6 is an illustrative diagram of the potential profile under the gate of a p-channel gain transistor of the type shown in FIGS. 2-5 that illustrates how holes may flow depending on a position of the drain Quasi Fermi level in accordance with an embodiment of the present invention.

For the sake of completeness of the pixel variable gain description, a simplified potential profile diagram 600 of the p-channel MOSFET gain transistor 202/410/510 along the channel region 602 is shown in FIG. 6. For low level signals, the drain Quasi Fermi level of is at level 603 with the extension 526 fully depleted. For high level signals, for larger number of electrons transferred from the photodiode, the Quasi Fermi level moves to the position 604 and the drain extension becomes again un-depleted. This increases the gate to drain capacitance Cf, thereby changing the in-pixel amplifier gain. The source of the p-channel MOSFET transistor is kept at a constant Vdd level 601.

Figure 8:
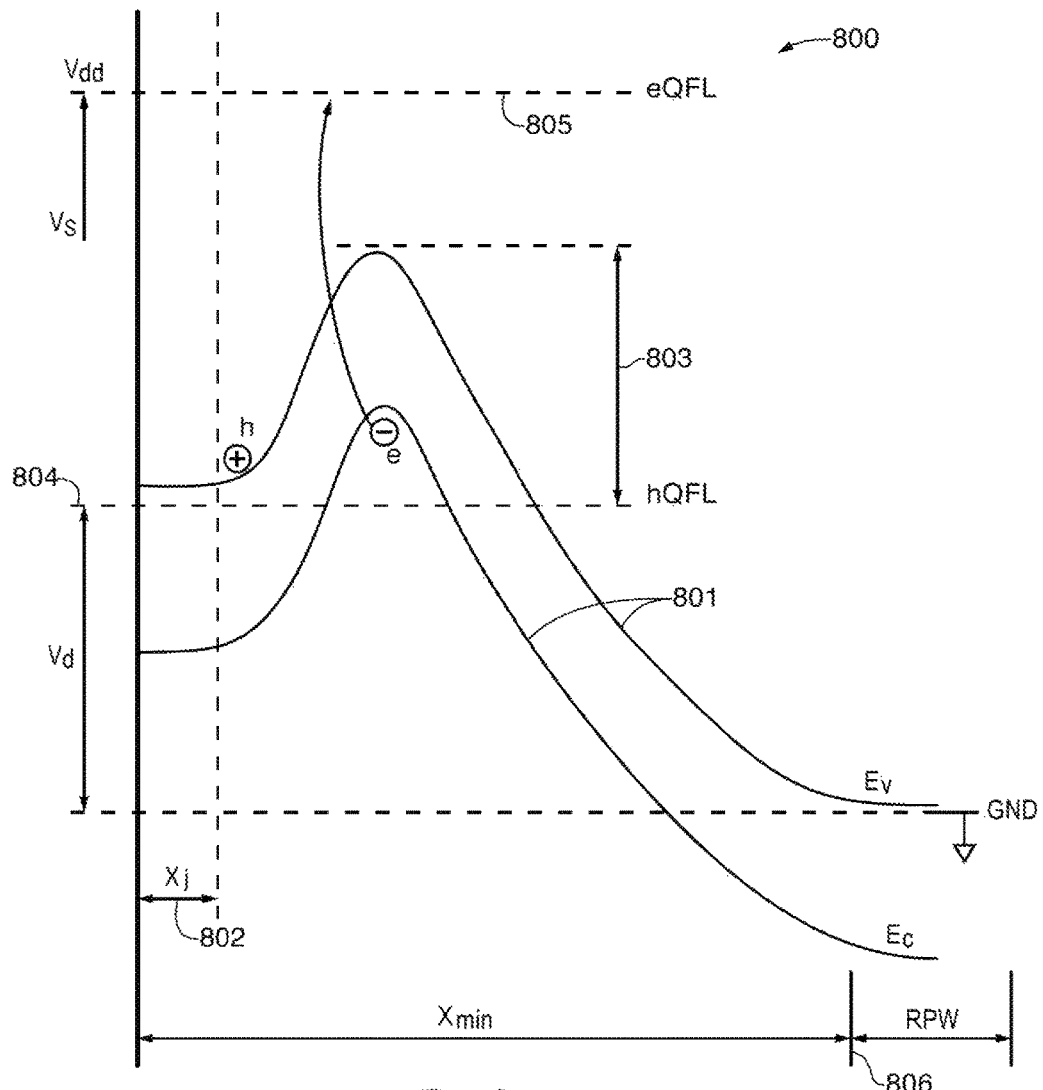
FIG. 8 is an illustrative diagram showing the bias potentials and energy band diagrams in a fully depleted mini n-well region under the drain of a p-channel MOSFET transistor of the type shown in FIGS. 2-7 in accordance with an embodiment of the present invention.

An example of various bias potentials and a corresponding energy band diagram within the fully depleted mini n-well under the drain of the p-channel MOSFET gain transistor 202/410/510 is shown in FIG. 8. As shown in FIG. 8, diagram 800 represents various bias potentials and the potential barrier for holes in the mini n-well region 405/505. The simplified energy band diagram under the transistor drain is represented by the curves 801. The transistor source and the drain junction depths are indicated as Xj 802. The n-type doped implant in the mini n-well region is used to form only a potential barrier for holes 803, thereby forcing holes to flow from the source along the transistor channel (perpendicular to the drawing plane of the figure) to drain. The sufficiently high barrier thus prevents shorting of the transistor drain and source to ground (the RPW region). The voltage level appearing on the transistor drain when a current bias is applied to it is shown as a Quasi Fermi level potential for holes Vd 804. The reference bias for the mini n-well is indicated by the Quasi Fermi level potential for electrons Vdd 805. The mini n-well depth is indicated as the region Xmin 806. It is thus clear that incorporation of the fully depleted mini n-well does not present any problem for the pixel, it does not occupy any additional valuable pixel area, and does not cause any problems such as injection of electrons or generation of additional dark current that would add to the photodiode dark current and thus degrade the overall image sensor performance. The mini n-well may also be only partially depleted of mobile electron charge (not shown in the example of FIG. 8).

In another suitable arrangement, the n-channel MOSFET reset transistor 206 can be replaced by a p-channel MOSFET transistor. In this scenario, the polarity of the reset gate pulses must be inverted. The advantage here is that the mini n-well can now be common to all the circuit transistors in the pixel except for the transfer gate transistors. This may have an advantage for some transistor design rule relaxation.

Figure 9:
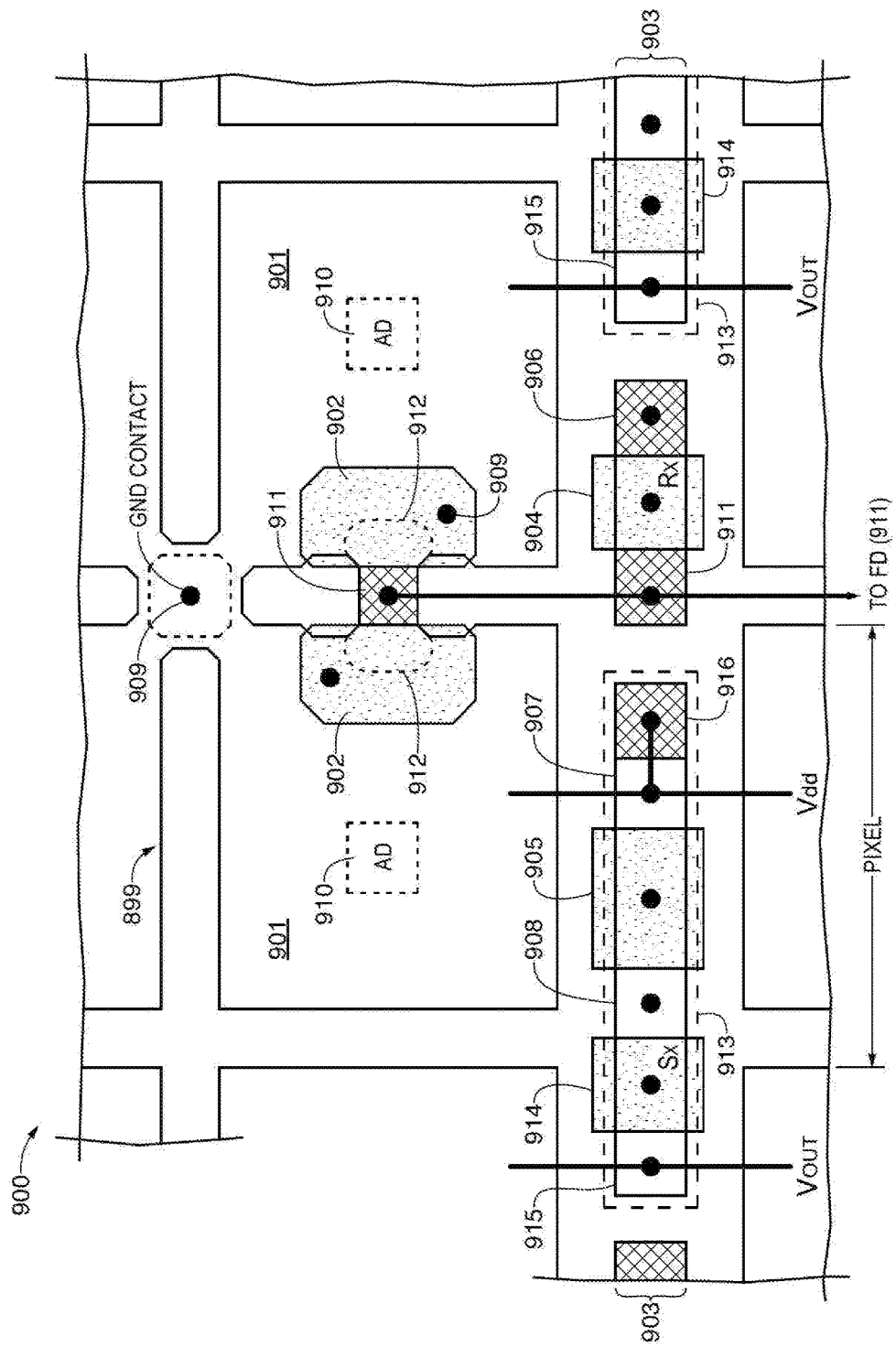
FIG. 9 is an illustrative layout diagram of a four photodiode per shared floating diffusion region pixel topology, in which the p-channel MOSFET gain transistor and the p-channel MOSFET addressing transistor are located in an STI region between photodiode rows in accordance with an embodiment of the present invention.

For the sake of completeness, an example of a 4-way shared pixel photodiode topology is shown in FIG. 9 (e.g., an arrangement in which four photodiodes share the same pixel circuitry). As shown in FIG. 9, drawing 900 represents a simplified pixel top view (not to scale). The active photodiode regions are shown by regions 901 and may include anti-dome (AD) implants and RPW compensating opening regions 910 located approximately in the center of the pixel photodiodes. Photodiode region 901 may be isolated from similar regions of the neighboring pixels by shallow trench isolation (STI) regions 899. This example is merely illustrative and, if desired, other types of pixel isolation, such as suitable implants or deep trench isolation (DTI) may be formed between the active pixel portions.

Charge transfer gates are shown by regions 902 that interface with the n+ type doped floating diffusion regions 911 connected together by a metal wiring bus. The transfer gates may have regions 912 implanted underneath, which form charge wells that improve the charge transfer efficiency. The n-channel MOSFET reset transistor, the p-channel MOSFET gain transistor, and the p-channel MOSFET addressing transistor are placed in the STI isolated trunk region 903 located between the photodiode rows. The p+ type doped p-channel MOSFET gain transistor source terminal and drain terminal are shown by regions 907 and 908 respectively. The transistor source terminal is connected to the adjacent n+ type doped region 916 that provides the bias contact for the mini n-well region delineated by the implant mask opening 913.

The p-channel MOSFET gain transistor gate is shown by region 905. The pixel addressing transistor gate is shown by region 914 and the p+ type doped drain of this transistor is shown by region 915, where the output signal is sensed. The source of this transistor is shared (common) with the drain of the p-channel MOSFET gain transistor 908. Similarly, the n-channel MOSFET reset transistor has its n+ type doped source region 906, but its drain region is connected to the floating diffusion regions 911. The n-channel MOSFET reset transistor gate is shown by region 904. The pixel wiring details have been omitted for the sake of simplicity. However, contact via 909 placements are indicated by the dark circles. The mask for forming the fully depleted or only the partially depleted mini n-well is indicated by the region bounded by the dashed line 913. A primary advantage of the 4-way shared PD layout shown in FIG. 9 is the less stringent requirement for the transistor design rules and a larger photodiode area, thereby resulting in a larger charge storage capacity in the pixel.

Having thus described the preferred embodiments of the novel image sensor array that has submicron size pixels with built-in amplification circuitry, where the gain of the built-in amplification circuitry is controlled by negative voltage feedback, which may vary in dependence on the number of sensed electrons transferred from the photodiode, the described details in this disclosure are thus intended to be illustrative and not limiting. It is noted that persons skilled in the art can make modifications and variations in light of the above teachings. It is therefore to be understood that changes may be made in the particular embodiments of the invention disclosed, which are within the scope and spirit of the invention as defined by the appended claims.

Figure 10:
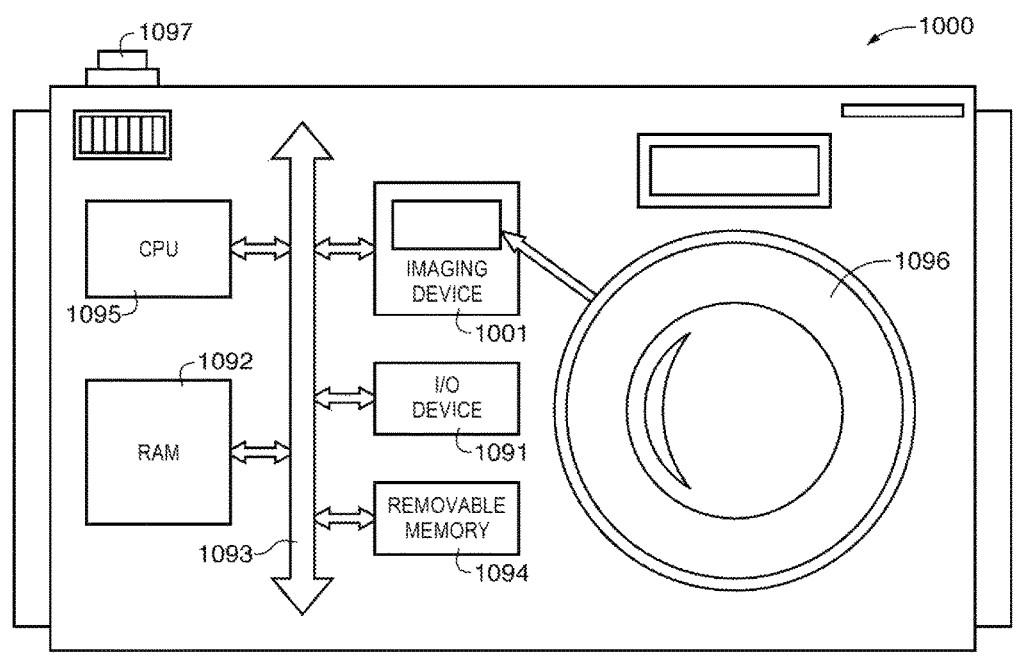
FIG. 10 is a block diagram of a processor system employing the image sensor pixels of FIGS. 2-9 in accordance with an embodiment of the present invention.

FIG. 10 shows in simplified form a typical processor system 10, such as a digital camera, which includes an imaging device such as imaging device 1001 (e.g., imaging device 1001 such as an image sensor that includes the backside illuminated global shutter pixels with an intra-pixel amplifying transistor and feedback capacitor as described above in connection with FIGS. 1-9). Processor system 1000 is exemplary of a system having digital circuits that could include imaging device 1001. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1096 for focusing an image onto a pixel array when shutter release button 1097 is pressed. Processor system 1000 may include a central processing unit such as central processing unit (CPU) 1095. CPU 1095 may be a microprocessor that controls camera functions and one or more image flow functions and communicates with one or more input/output (I/O) devices 1091 over a bus such as bus 1093. Imaging device 1001 may also communicate with CPU 1095 over bus 1093. System 1000 may include random access memory (RAM) 1092 and removable memory 1094. Removable memory 1094 may include flash memory that communicates with CPU 1095 over bus 1093. Imaging device 1001 may be combined with CPU 1095, with or without memory storage, on a single integrated circuit or on a different chip. Although bus 1093 is illustrated as a single bus, it may be one or more buses or bridges or other communication paths used to interconnect the system components.

Various embodiments have been described illustrating an imaging system (e.g., image sensor pixel array) having a built-in amplifying circuit and a negative voltage feedback capacitor that allow for increased photodiode capacity and dynamic range relative to conventional imaging systems. The array may include a number of image sensor pixels arranged in rows and columns.

The image sensor pixels may each include a photodiode that generates charge in response to image light, a floating diffusion node, and a charge transfer transistor configured to transfer the generated charge from the photodiode to the floating diffusion node. An amplifying transistor (sometimes referred to herein as a gain transistor) may have a gate terminal coupled to the floating diffusion node, a drain terminal coupled to a pixel output node, and a source terminal coupled to a bias voltage column line. A feedback capacitor may be coupled between the pixel output node and the floating diffusion node and may be configured to provide negative voltage feedback for the floating diffusion node. The amplifying transistor may be configured to provide the transferred charge with greater than unity again (e.g., a gain greater than one such that signals at the floating diffusion node have a lesser magnitude than signals at the pixel output node).

The pixels may include a reset transistor coupled between the pixel output node and the floating diffusion node in parallel with the feedback capacitor that is configured to reset the floating diffusion node to a reset voltage and/or to drain overflow charge from the floating diffusion node. The pixel output node may be coupled to a column readout line through a pixel addressing (row select) transistor. A column biasing current source may be coupled to the pixel through the column readout line. A pre-charge capacitor may be coupled between the floating diffusion node and as pre-charge bus line. If desired, the reset transistor may include an n-channel reset transistor whereas the amplifying transistor and the addressing transistor may each include a corresponding p-channel amplifying transistor. For example, the reset transistor may include a p-channel MOSFET whereas the amplifying transistor and the addressing transistor may include corresponding n-channel MOSFETs. In another suitable arrangement, the reset transistor may include a p-channel MOSFET, whereas the amplifying transistor and the addressing transistor include respective n-channel MOSFETs.

The pixel substrate may include a p-type doped epitaxial layer and an n-type doped well region within which the p-channel amplifying transistor and addressing transistor are formed (or a p-type doped well region within which the n-channel amplifying transistor and addressing transistor are formed). A p+ type retrograde doped electron blocking layer in the semiconductor substrate may separate the n-type doped well region from the p-type doped epitaxial layer (or an n+ type retrograde doped electron blocking layer may separate the p-type doped well region from an n-type doped epitaxial layer).

If desired, the feedback capacitor may have a variable capacitance that depends on a potential difference between the gate terminal of the amplifying transistor and the drain terminal of the amplifying transistor. The pixel may be formed in a system that also includes a central processing unit, memory, input-output circuitry, and a lens.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
   a photodiode that generates charge in response to image light;
   a floating diffusion node;
   a charge transfer transistor configured to transfer the generated charge from the photodiode to the floating diffusion node;
   an amplifying transistor having a drain terminal coupled to a pixel output node, wherein the floating diffusion node is coupled between a drain terminal of the charge transfer transistor and a gate terminal of the amplifying transistor;
   a feedback capacitor coupled between the pixel output node and the floating diffusion node, wherein the amplifying transistor is configured to provide the transferred charge with a greater than unity gain and the feedback capacitor is configured to provide negative voltage feedback to the floating diffusion node; and
   a pre-charge capacitor coupled between the floating diffusion node and a pre-charge bus line.

2. The image sensor pixel defined in claim 1, further comprising:
   a reset transistor coupled between the pixel output node and the floating diffusion node in parallel with the feedback capacitor, wherein the reset transistor is configured to reset the floating diffusion node to a reset voltage.

3. The image sensor pixel defined in claim 2, further comprising:
   a column readout line coupled to a column biasing current source; and
   a pixel addressing transistor coupled between the pixel output node and the column readout line.

4. The image sensor pixel defined in claim 2, wherein the reset transistor comprises an n-channel reset transistor and the amplifying transistor comprises a p-channel amplifying transistor.

5. The image sensor pixel defined in claim 4, wherein the p-channel amplifying transistor has a source terminal coupled to a column bias voltage line.

6. The image sensor pixel defined in claim 4, wherein the image sensor pixel is formed on a semiconductor substrate, further comprising:
   a p-type doped epitaxial layer in the semiconductor substrate;
   an n-type doped well region in the semiconductor substrate, wherein the p-channel amplifying transistor is formed within the n-type doped well region; and
   a p+ type retrograde doped electron blocking layer in the semiconductor substrate that separates the n-type doped well region from the p-type doped epitaxial layer.

7. The image sensor pixel defined in claim 2, wherein the reset transistor comprises a p-channel reset transistor and the amplifying transistor comprises an n-channel amplifying transistor.

8. The image sensor pixel defined in claim 1, wherein the amplifying transistor comprises an n-channel amplifying transistor and wherein the image sensor pixel is formed on a semiconductor substrate, the image sensor pixel further comprising:
   an n-type doped epitaxial layer in the semiconductor substrate;

a p-type doped well region in the semiconductor substrate, wherein the n-channel amplifying transistor is formed within the p-type doped well region; and an n+ type retrograde doped electron blocking layer in the semiconductor substrate that separates the p-type doped well region from the n-type doped epitaxial layer.

9. The image sensor pixel defined in claim 1, wherein the feedback capacitor has a variable capacitance that depends on a potential difference between the gate terminal of the amplifying transistor and the drain terminal of the amplifying transistor.

10. The image sensor pixel defined in claim 1, wherein the image sensor pixel is formed on a semiconductor substrate, further comprising:

pixel isolation regions selected from a group consisting of: shallow trench isolation regions and deep trench isolation regions, wherein the pixel isolation regions are configured to isolate the photodiode from other photodiodes on the semiconductor substrate.

11. The image sensor pixel defined in claim 1, wherein the image sensor pixel is formed on a semiconductor substrate having opposing front and back sides, wherein the photodiode is configured to generate the charge in response to image light received through the back side of the semiconductor substrate.

12. The image sensor pixel defined in claim 1, wherein the image sensor pixel is formed on a semiconductor substrate, wherein the semiconductor substrate is coupled to an additional semiconductor substrate, wherein a bias current source for the image sensor pixel is formed on the additional semiconductor substrate, and wherein the pixel output node is coupled to the bias current source on the additional semiconductor substrate through a conductive via.

13. An image sensor pixel formed on a semiconductor substrate, comprising:

a photosensitive region;

a charge storage region configured to store charge generated by the photosensitive region;

a transistor having a gate terminal coupled to the charge storage region and a drain terminal coupled to a pixel output node, wherein the transistor is configured to provide a gain greater than unity to signals transferred to the pixel output node;

a negative voltage feedback capacitor coupled between the pixel output node and the charge storage region;

a row select transistor coupled between the pixel output node and a column readout line, wherein a source terminal of the row select transistor is coupled to the pixel output node;

a reset transistor coupled between the pixel output node and the charge storage region; and a current source coupled to a drain terminal of the row select transistor.

14. The image sensor pixel defined in claim 13, wherein the negative voltage feedback capacitor has a variable capacitance dependent upon a potential difference between the gate and the drain of the transistor.

15. The image sensor pixel defined in claim 13, wherein the transistor comprises a first p-channel metal-oxide-semiconductor field-effect transistor (MOSFET), the row select transistor comprises a second p-channel MOSFET, and the reset transistor comprises an n-channel MOSFET.

16. The image sensor pixel defined in claim 13, wherein the transistor comprises a first n-channel metal-oxide-semiconductor field-effect transistor (MOSFET), the row select transistor comprises a second n-channel MOSFET, and the reset transistor comprises a p-channel MOSFET.

17. A system, comprising: a central processing unit; memory; input-output circuitry; and an imaging device, wherein the imaging device comprises:

a pixel array having at least one pixel circuit, and a lens that focuses an image onto the pixel array, wherein the pixel array comprises a semiconductor substrate and an n-type doped well region in the semiconductor substrate, wherein the at least one pixel circuit comprises:

a photodiode that generates charge in response to image light;

a floating diffusion region;

a charge transfer transistor configured to transfer the generated charge from the photodiode to the floating diffusion node;

a p-channel gain transistor having a gate terminal coupled to the floating diffusion node and a drain terminal coupled to a pixel output node, wherein the p-channel gain transistor is formed in the n-type doped well region, wherein the drain terminal is formed from a P+ type doped region in the n-type doped well region that is adjacent to the p-channel gain transistor;

a p-type doped extension region that is formed in the n-type doped well region adjacent to the p-channel gain transistor and the P+ type doped region, wherein the p-type doped extension region extends under a gate terminal of the p-channel gain transistor;

a feedback capacitor coupled between the pixel output node and the floating diffusion region, wherein the p-channel gain transistor is configured to provide the transferred charge with a gain that is greater than one and the feedback capacitor is configured to provide negative voltage feedback to the floating diffusion node; and an n-channel reset transistor coupled between the pixel output node and the floating diffusion region in parallel with the feedback capacitor.

* * * * *